United States Patent
Tanaka et al.

(10) Patent No.: US 9,780,175 B2
(45) Date of Patent: Oct. 3, 2017

(54) NITRIDE SEMICONDUCTOR EPITAXIAL WAFER AND FIELD EFFECT NITRIDE TRANSISTOR

(71) Applicant: HITACHI CABLE, LTD., Tokyo (JP)

(72) Inventors: Takeshi Tanaka, Naka-gun (JP); Naoki Kaneda, Tsuchiura (JP); Yoshinobu Narita, Mito (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 0 days.

(21) Appl. No.: 13/722,457

(22) Filed: Dec. 20, 2012

(65) Prior Publication Data

US 2013/0187172 A1   Jul. 25, 2013

(30) Foreign Application Priority Data

Jan. 25, 2012 (JP) ................... 2012-012920
Mar. 30, 2012 (JP) ................... 2012-078469

(51) Int. Cl.
| | |
|---|---|
| *H01L 29/20* | (2006.01) |
| *H01L 29/16* | (2006.01) |
| *H01L 29/778* | (2006.01) |
| *H01L 29/04* | (2006.01) |
| *H01L 21/02* | (2006.01) |

(52) U.S. Cl.
CPC ...... *H01L 29/2003* (2013.01); *H01L 21/0237* (2013.01); *H01L 21/0254* (2013.01); *H01L 21/0259* (2013.01); *H01L 21/0262* (2013.01); *H01L 21/02378* (2013.01); *H01L 21/02458* (2013.01); *H01L 21/02494* (2013.01); *H01L 21/02502* (2013.01); *H01L 29/04* (2013.01); *H01L 29/1608* (2013.01); *H01L 29/7786* (2013.01)

(58) Field of Classification Search
CPC ............ H01L 29/2003; H01L 21/0254; H01L 21/02458; H01L 21/0243; H01L 33/16; H01L 21/02609; H01L 21/02433
USPC ........................ 257/192–194, E33.049, 77
See application file for complete search history.

(56) References Cited

U.S. PATENT DOCUMENTS 6,316,793 B1    11/2001   Sheppard et al.
7,985,984 B2 *   7/2011   Nakayama .......... H01L 29/7781
                                                         257/190

(Continued)

FOREIGN PATENT DOCUMENTS

| JP | 2001-093344 A | 4/2001 |
| JP | 2009-032713 A | 2/2009 |

OTHER PUBLICATIONS

Japanese Patent Office Action dated Dec. 10, 2014 and English translation of notice of reasons for rejection.

(Continued)

*Primary Examiner* — Marc Armand
*Assistant Examiner* — Quinton Brasfield
(74) *Attorney, Agent, or Firm* — Roberts Mlotkowski Safran Cole & Calderon P.C.

(57) ABSTRACT

A nitride semiconductor epitaxial wafer includes a substrate, a GaN layer provided over the substrate, and an AlGaN layer provided over the GaN layer. The GaN layer has a wurtzite crystal structure, and a ratio c/a of a lattice constant c in a c-axis orientation of the GaN layer to a lattice constant a in an a-axis orientation of the GaN layer is not more than 1.6266.

6 Claims, 4 Drawing Sheets

(56) References Cited

U.S. PATENT DOCUMENTS

| | | |
|---|---|---|
| 8,450,146 B2 | 5/2013 | Tanaka et al. |
| 2003/0232457 A1 | 12/2003 | Kawaguchi et al. |
| 2004/0079959 A1* | 4/2004 | Udagawa ...................... 257/103 |
| 2006/0237711 A1* | 10/2006 | Teraguchi ........... H01L 29/7787 257/14 |
| 2008/0237610 A1* | 10/2008 | Imanishi ........... H01L 21/02378 257/77 |
| 2009/0045438 A1* | 2/2009 | Inoue et al. .................. 257/192 |
| 2009/0258452 A1* | 10/2009 | Enya et al. ............. 257/E21.09 |
| 2010/0025730 A1* | 2/2010 | Heikman et al. ............. 257/194 |
| 2010/0301393 A1* | 12/2010 | Teraguchi ..................... 257/192 |
| 2011/0006346 A1* | 1/2011 | Ando et al. .................. 257/192 |
| 2011/0073911 A1* | 3/2011 | Sato ..................... H01L 29/107 257/194 |
| 2011/0101391 A1 | 5/2011 | Miki et al. |
| 2011/0127540 A1* | 6/2011 | Yamada .............. H01L 29/0657 257/76 |
| 2011/0297960 A1 | 12/2011 | Tanaka et al. |
| 2012/0132962 A1* | 5/2012 | Sato ........................ C30B 25/02 257/201 |

OTHER PUBLICATIONS

JP Office Action and English translation of notification of reasons for refusal dated Apr. 7, 2015.

Chinese Patent Office Action for application under 20131002795332 and English translation thereof dated Feb. 4, 2017.

* cited by examiner

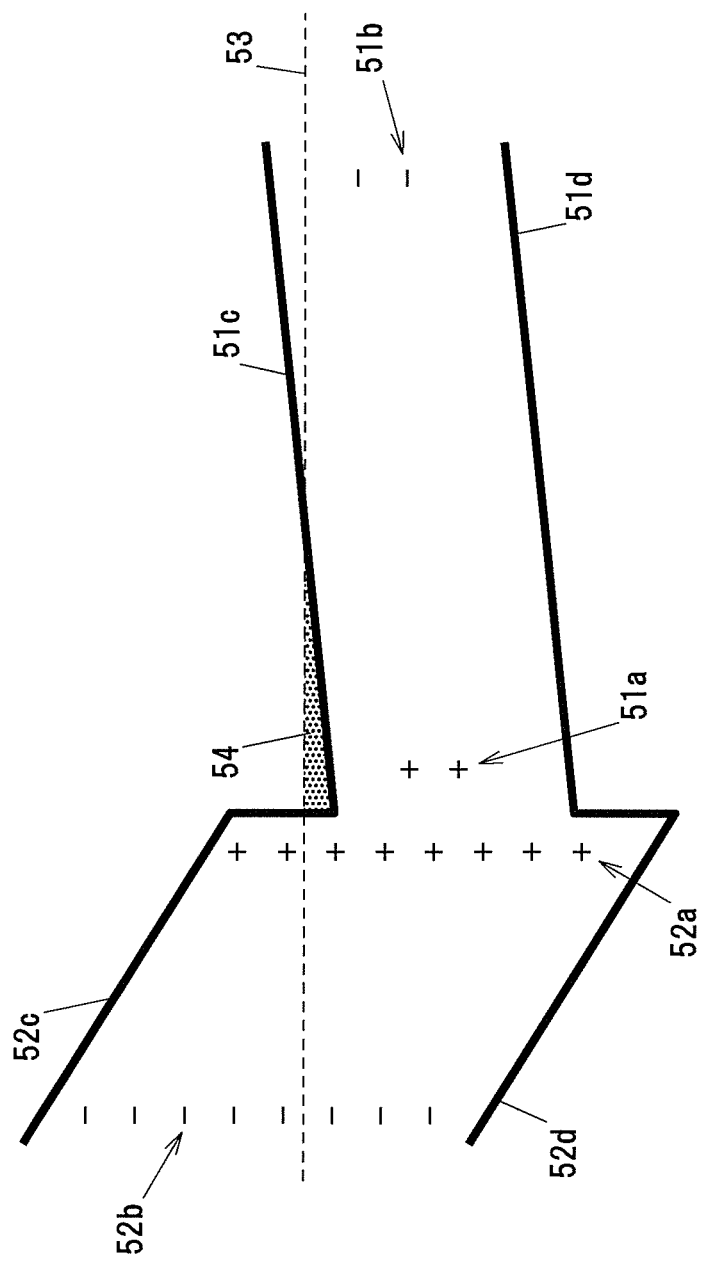

NITRIDE SEMICONDUCTOR EPITAXIAL WAFER AND FIELD EFFECT NITRIDE TRANSISTOR

The present application is based on Japanese patent application No. 2012-12920 filed on Jan. 25, 2012 and Japanese patent application No. 2012-078469 filed on Mar. 30, 2012, the entire contents of which are incorporated herein by reference.

BACKGROUND OF THE INVENTION

1. Field of the Invention

This invention relates to a nitride semiconductor epitaxial wafer and a field effect nitride transistor.

2. Description of the Related Art

In conventional art, nitride semiconductors containing indium (In), gallium (Ga), aluminum (Al), nitrogen (N) and the like have been being developed and put into practical use as materials for innovative high-efficiency light emitting devices which cover most of ultraviolet to visible light regions, by controlling a group III element composition ratio therein.

In addition, the nitride semiconductors have been put into practical use as materials for electronic devices to achieve high efficiencies and high outputs in high frequency regions, because of having high saturation electron velocity and high dielectric breakdown voltage.

JP-A-2009-32713 discloses a nitride semiconductor transistor in which a channel layer is formed of GaN, and which has a cap layer whose lattice constant is greater than that of GaN, so that when electrons in the channel formed in a heterojunction structure are accelerated, they are not easily trapped at a surface level.

JP-A-2010-272887 discloses a group III nitride semiconductor device in which a lattice constant in an a-axis of a buffer layer is smaller than a lattice constant in an a-axis of bulk AlN, in order to enhance the homogeneity of the buffer layer, and enhance the crystallinity of the group III nitride semiconductor formed over the buffer layer.

Refer to JP-A-2009-32713 and JP-A-2010-272887.

SUMMARY OF THE INVENTION

In field effect nitride transistors, there arises the problem of current collapse. The current collapse is a phenomenon which prominently appears in field effect nitride transistors, and which greatly reduces drain current during high-voltage operation. This current collapse is understood as follows: Due to biasing the transistor, carriers are trapped at a trap level in a device structure, and the trapped carriers form a negative electric field to inhibit the flow of free carriers, resulting in a decrease in drain current or an increase in on-resistance in the device structure.

An origin of the trap level in the current collapse has been assumed to be an AlGaN barrier layer, and the importance of a constituent resulting from the GaN layer which lies under the AlGaN barrier layer and which is a practical electron transit portion has also been pointed out (See, e.g., JP-A-2004-517461).

In general, lattice constants at room temperature of naturally occurring crystals are constant values based on the laws of nature. For example, according to Bougrov, et al. (Bougrov V., Levinshtein M. E., Rumyantsev S. L., Zubrilov A., in Properties of Advanced Semiconductor Materials GaN, AlN, InN, BN, SiC, SiGe. Eds. Levinshtein M. E., Rumyantsev S. L., Shur M. S., John Wiley & Sons, Inc., New York, 2001, 1-30.), a lattice constant in a c-axis orientation of wurtzite GaN is assumed to be 5.186 [Å]. In this case, a ratio "c/a" of the lattice constant "c" in the c-axis orientation to a lattice constant "a" in an a-axis orientation of GaN is 1.6271. On the other hand, a thin GaN layer which is formed over a bulk hetero substrate is affected by stress due to lattice mismatch with the substrate or interlayer stress in multilayer film structure or the like. For this reason, the ratio c/a of the lattice constants does not necessarily match a specified value based on natural laws.

For example, if a thin wurtzite GaN layer which causes a Ga face with a polarity to appear at an outermost surface is formed over a substrate whose lattice constant in an a-axis is smaller than that of GaN without taking special care, it can readily be understood that GaN is likely to be subject to a-axis orientation compressive stress or in other words, lateral compressive stress. The GaN lattice subject to the lateral compression may be elongated in a c-axis orientation due to straining. That is, the lattice constant in the c-axis orientation of GaN is longer than 5.186 [Å], which is a value based on the laws of nature, and is highly likely to present a greater value such as 5.188 [Å] or 5.189 [Å] than that value.

FIG. 3 is a graph showing a relationship between the lattice constant in a c-axis orientation of a GaN layer and the c/a ratio of a lattice constant c in a c-axis orientation to a lattice constant a in an a-axis orientation of the GaN layer. As shown in FIG. 3, the greater the c-axis lattice constant, the greater the ratio c/a. It is known that when crystals are subject to stress, the crystals such as hexagonal crystals of GaN, AlN, AlGaN and the like induce charges due to the piezoelectric effect between both polar end faces. For example, the GaN layer as described above is subject to the lateral compressive stress, and has charges in the upper and lower polar end faces of the GaN layer.

FIG. 4 is a diagram showing a band profile in a depth direction of a conventional nitride semiconductor epitaxial wafer. The epitaxial structure for a typical field effect nitride transistor has a more strained AlGaN layer over the GaN layer. The AlGaN layer over the GaN layer is subject to lateral tensile stress due to a lattice mismatch between the AlGaN layer and the GaN layer. The GaN layer has positive charges 51a in a surface side and negative charges 51b in a substrate side. The AlGaN layer has positive charges 52a in an interface side with the GaN layer, and negative charges 52b in the substrate side. It has been known that the positive charges 52a present in the interface side with the GaN layer of the AlGaN layer induce a high concentration of electrons near the interface in the side of the GaN layer whose electron affinity is greater than that of AlGaN, to form a two-dimensional electron gas 54 therein. It should be noted that in FIG. 4, 51c is a conduction band of the GaN layer, 51d is a valence band of the GaN layer, 52c is a conduction band of the AlGaN layer, and 52d is a valence band of the AlGaN layer.

Both the GaN side positive charges 51a and the AlGaN side positive charges 52a reduce a potential at the interface, to induce the high concentration of electrons, i.e. the two-dimensional electron gas 54 below the Fermi surface 53. From this point of view, these effects are the same. On the other hand, it is also necessary to note a difference between the AlGaN side and the GaN side. That is, the AlGaN side charges 52a and 52b have little impact on the motion of electrons because they are spatially separated from the two-dimensional electron gas 54. On contrast, the GaN side charges 51a and 51b are considered to be likely to act as an electron trap because they are spatially overlapped with the two-dimensional electron gas 54. In other words, the positive charges 52a in the vicinity of the interface due to the piezoelectric effect caused by the tensile strain in the AlGaN layer induce the high concentration of the two-dimensional electron gas 54, and have the favorable effect of no interference with the motion of the two-dimensional electron gas 54. On the other hand, the positive charges 51a in the vicinity of the interface due to the piezoelectric effect caused by the compressive strain in the GaN layer trap electrons and adversely affect the operation of the transistor. This is considered as one of the causes of the current collapse.

The occurrence of such current collapse has been a problem in the operation of the field effect nitride transistor due to degrading the output of the device. However, the conventional field effect transistor is not sufficient to suppress the occurrence of current collapse due to having positive charges caused by the compressive strain in the GaN layer in the surface side of the GaN layer.

Accordingly, it is an object of the present invention to provide a nitride semiconductor epitaxial wafer and a field effect nitride transistor, capable of suppressing current collapse.

To achieve the above object, the present invention provides a nitride semiconductor epitaxial wafer and a field effect nitride transistor below.

(1) According to one embodiment of the invention, a nitride semiconductor epitaxial wafer comprises:

a substrate;

a GaN layer provided over the substrate; and an AlGaN layer provided over the GaN layer, wherein the GaN layer comprises a wurtzite crystal structure, and a ratio c/a of a lattice constant c in a c-axis orientation of the GaN layer to a lattice constant a in an a-axis orientation of the GaN layer is not more than 1.6266.

In one embodiment, the following modifications and changes can be made.

(i) The nitride semiconductor epitaxial wafer may further comprise a single-layer or multilayer buffer layer provided between the substrate and the GaN layer.

(ii) The buffer layer may comprise an AlN layer.

(iii) The substrate may comprise polytype 4H or polytype 6H silicon carbide.

(2) According to another embodiment of the invention, a field effect nitride transistor comprises:

a substrate;

a GaN layer provided over the substrate;

an AlGaN layer provided over the GaN layer;

a source electrode and a drain electrode provided directly or via an intermediate layer on the AlGaN layer, and a gate electrode provided between the source electrode and the drain electrode, wherein the GaN layer comprises a wurtzite crystal structure, and a ratio c/a of a lattice constant c in a c-axis orientation of the GaN layer to a lattice constant a in an a-axis orientation of the GaN layer is not more than 1.6266.

In another embodiment, the following modifications and changes can be made.

(i) The field effect nitride transistor may further comprise a single-layer or multilayer buffer layer provided between the substrate and the GaN layer.

(ii) The buffer layer may comprise an AlN layer.

(iii) The substrate may comprise a polytype 4H or polytype 6H silicon carbide.

Points of the Invention

According to the present invention, it is possible to provide the nitride semiconductor epitaxial wafer and the field effect nitride transistor that are able to suppress the current collapse.

BRIEF DESCRIPTION OF THE DRAWINGS

The preferred embodiments according to the invention will be explained below referring to the drawings, wherein:

FIG. 4 is a diagram showing a band profile in a depth direction of a conventional nitride semiconductor epitaxial wafer.

DETAILED DESCRIPTION OF THE PREFERRED EMBODIMENTS

Summary of the Embodiment

A nitride semiconductor epitaxial wafer in the present embodiment includes a substrate, a GaN layer provided over the substrate, and an AlGaN layer provided over the GaN layer. In the nitride semiconductor epitaxial wafer, the GaN layer comprises a wurtzite crystal structure, and a ratio c/a of a lattice constant c in a c-axis orientation of the GaN layer to a lattice constant a in an a-axis orientation of the GaN layer is not more than 1.6266.

Setting the ratio c/a of the lattice constant c in the c-axis orientation to the lattice constant a in the a-axis orientation of the GaN layer at not more than 1.6266 allows the occurrence of no positive charge, but negative charges on a surface of the GaN layer, to reduce electron trap, or suppress current collapse.

Embodiment

Figure 1:
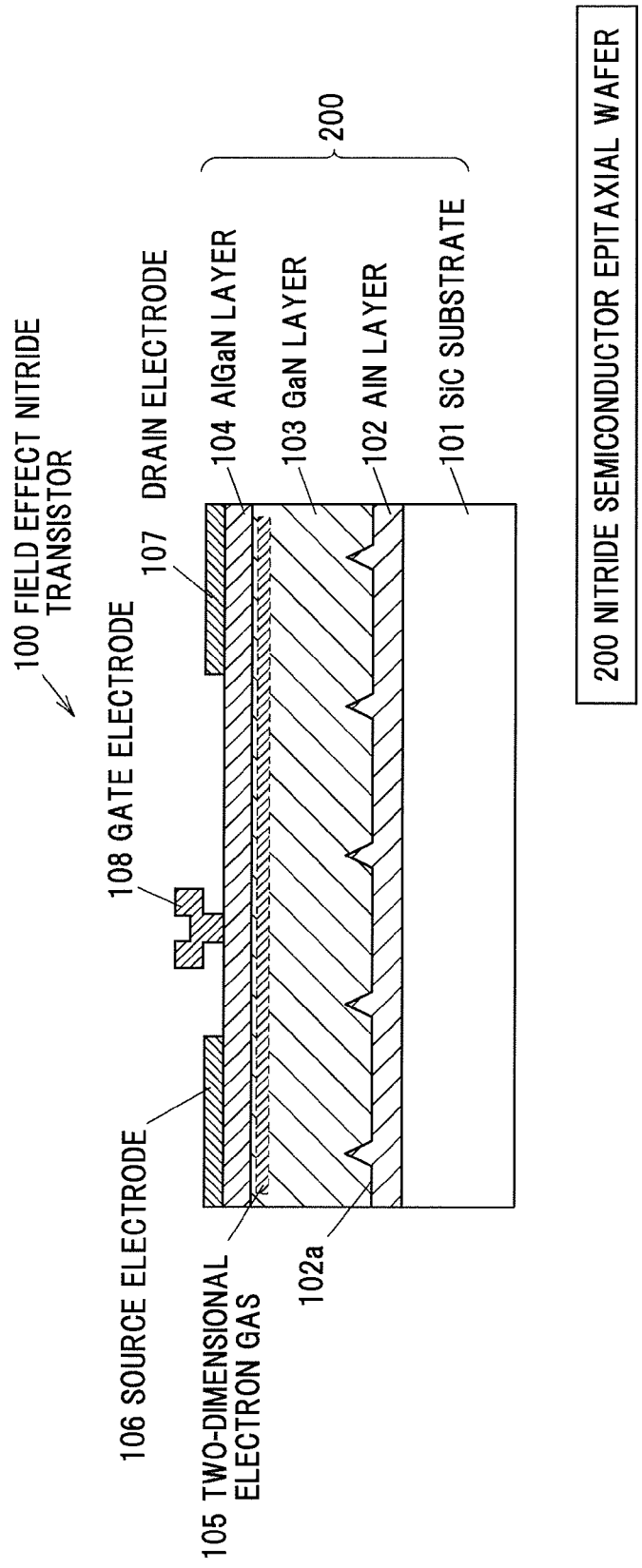
FIG. 1 is a cross-sectional view showing a schematic configuration example of a field effect nitride transistor in an embodiment according to the invention.

FIG. 1 is a cross-sectional view showing a schematic configuration example of a field effect nitride transistor 100 in an embodiment according to the invention.

This field effect nitride transistor 100 is a GaN based HEMT (High Electron Mobility Transistor), and includes, e.g., a silicon carbide (SiC) substrate 101 as a substrate. Over the SiC substrate 101, there are epitaxially grown an aluminum nitride (AlN) layer 102, a gallium nitride (GaN) layer 103, and an aluminum gallium nitride (AlGaN) layer 104 in this order to form a nitride semiconductor epitaxial wafer 200, and a source electrode 106, a drain electrode 107 and a gate electrode 108 are formed on the AlGaN layer 104.

As the SiC substrate 101, a polytype 4H or polytype 6H semi-insulative SiC substrate may be used. Here, the number in 4H or 6H denotes a repetition period in a c-axis orientation, and H therein denotes a hexagonal crystal. As the substrate, in order to reduce parasitic capacitance and provide good high-frequency characteristics, the semi-insulative SiC substrate is preferred, but a conductive SiC substrate, sapphire substrate, silicon substrate, GaN substrate or the like may be used.

The AlN layer 102 has a surface 102a which is shaped to have a positive skewness Rsk (i.e. the skewness Rsk is positive), and functions as a nucleation layer as well as a buffer layer for buffering a lattice constant difference between the SiC substrate 101 and the GaN layer 103. The skewness Rsk represents a surface roughness curve, and is a physical quantity (unitless number) expressed in terms of a mean cube of a height deviation Z(x) in reference length divided by a cube of a root mean square. The shape of the surface 102a having the positive skewness Rsk indicates the presence of sharp upward protrusions, while the shape of the surface 102a having a negative skewness Rsk indicates the presence of sharp downward depressions. In order to suppress the current collapse, the skewness Rsk is preferably positive, more preferably not less than 0.5.

The GaN layer 103 has a wurtzite crystal structure, and functions as an electron transit layer. In an AlGaN layer 104 side of the GaN layer 103 (i.e. in a side of the GaN layer 103, and the side is close to the AlGaN layer 104), there is a two-dimensional electron gas 105 generated by the piezoelectric effect (electric field effect produced by crystal strain) in the AlGaN layer 104 resulting from a lattice constant difference between the GaN layer 103 and the AlGaN layer 104.

Ratio c/a in the GaN Layer 103

In addition, setting a ratio c/a of a lattice constant c in a c-axis orientation to a lattice constant a in an a-axis orientation of the GaN layer 103 at not more than 1.6266 allows reducing the occurrence of current collapse to not more than 1.2. Furthermore, from the point of view of stability, the ratio c/a is more preferably 1.6260. In addition, a production method which will be described later allows the ratio c/a of the lattice constants of the GaN layer 103 to be easily set at not less than 1.6256 and not more than 1.6266. The field effect nitride transistor 100 using the nitride semiconductor epitaxial wafer 200 with the ratio c/a in the range of not more than 1.6266 allows the occurrence of no positive charge, but negative charges on the surface of the GaN layer 103 on which the two-dimensional electron gas 105 is induced spatially, to suppress current collapse.

The AlGaN layer 104 functions as an electron feed layer, and induces the piezoelectric effect in the GaN layer 103.

The source electrode 106 has e.g. a double layer structure of titanium and aluminum. The drain electrode 107 has e.g. a double layer structure of titanium and aluminum. The gate electrode 108 has e.g. a double layer structure of nickel and gold. In addition, intermediate layers may be formed between the AlGaN layer 104 and the source electrode 106, between the AlGaN layer 104 and the drain electrode 107, and between the AlGaN layer 104 and the gate electrode 108, respectively. This intermediate layer comprises GaN or the like.

Control of the Skewness of the Surface of the AlN Layer 102

The control of the skewness of the surface of the AlN layer 102 is considered to be related to a group V to group III raw material feed mole ratio (V/III ratio). In order to make the skewness Rsk positive, the V/III ratio is preferably 1000 to 8000.

Al atoms decomposed from trimethyl aluminum (TMA) fed to the growth face or substrate surface (herein referred to as "growth face") react with N atoms in the growth face to form AlN. In addition, in the initial stage of growth of the AlN layer 102, an AlN crystal is grown over the surface of the SiC substrate 101. When the V/III ratio is in the range of 1000 to 8000, the Al atoms decomposed from the TMA fed to the growth face tend to move in the surface of the growth face. The tendency to move in the growth face is considered as the tendency to reach the AlN crystal from which growth results, and develop growth. In this case, since growth resulting from the AlN crystal formed in the initial period of growth is developed to grow the AlN crystal in a protruding shape, the skewness of the resulting AlN layer 102 is positive.

When the AlN layer 102 is grown by setting the V/III ratio to be as high as 10000, it is assumed the growth will be developed in the same manner as described above until the AlN crystal is formed during a initial growth step, but because the V/III ratio is set to be as high as 10000, the movement of the Al atoms in the growth face is suppressed. As a result, the AlN crystal is formed uniformly over the surface of the growth face and its growth is developed to form a plurality of crests formed of the AlN crystal on the growth face. It is further assumed that there remain grain boundaries (boundaries occur when the plural flat crests formed of AlN are joined together) or defects (inhibited crystal growth portions) which occur during the growth of the AlN layer 102, and consequently the skewness of the AlN layer 102 becomes negative.

Fabricating Method for the Embodiment

Next, one example of a method of fabricating the nitride semiconductor epitaxial wafer 200 and the field effect nitride transistor 100 will be explained below.

In this embodiment, a production method which promotes the island growth of the thin GaN layer 103 over the SiC substrate 101, to cause tension between dangling bonds which are formed during bonding between islands, to cause tensile stress in the entire thin GaN layer 103 is used.

First, the SiC substrate 101 is treated at a high temperature in a hydrogen ($H_2$) atmosphere containing no ammonia ($NH_3$). The SiC substrate 101 is treated in an $NH_3$ gas atmosphere only for a predetermined period of time (e.g. within 30 seconds). The AlN layer 102 with such a roughness that the surface skewness Rsk is positive is formed to have a predetermined thickness (e.g. of not more than 1/20 of the film thickness of the GaN layer 103).

After the formation of the AlN layer 102, the SiC substrate 101 is cooled at a temperature (e.g. 1100 to 1150 degrees Celsius) which is lower by not less than 50 degrees Celsius than a predetermined temperature (e.g. a formation temperature such as 1150 to 1200 degrees Celsius) of the AlN layer 102 in the conditions of a $H_2/NH_3$ gas mixture atmosphere wherein $H_2/NH_3$ ratio is not less than 4, to stabilize the temperature. Subsequently, the GaN layer 103 is formed to have a thickness not less than 20 times greater than the film thickness of the AlN layer 102. Over the GaN layer 103, the AlGaN layer 104 with an appropriate thickness is stacked, to form the nitride semiconductor epitaxial wafer 200.

Then, the source electrode 106, the drain electrode 107 and the gate electrode 108 are formed on the AlGaN layer 104. Around the HEMT device, a device isolation trench is formed by dry etching. In addition, an insulating region may be provided by ion implantation to perform device isolation. The above steps result in the formation of the field effect nitride transistor 100.

Next is described an example one example of a method of fabricating the field effect nitride transistor in Examples according to the present invention.

Example 1

First, as a substrate, a polytype 4H or polytype 6H semi-insulative SiC substrate 101 is prepared. The SiC substrate 101 is then introduced into an MOVPE (Metal Organic Vapor Phase Epitaxy) apparatus, to be heat treated for 5 minutes at a set temperature of 1175 degrees Celsius in $H_2/N_2$ gas mixture flow atmosphere that does not contain $NH_3$. This heating cleans the surface of the SiC substrate 101.

Next, an ammonia gas ($H_2/NH_3$ gas mixture) is introduced into a reactor of the MOVPE apparatus for 25 seconds at the temperature held at 1175 degrees Celsius. This ammonia gas flow prevents desorption of nitrogen atoms in the subsequent AlN forming step, to make AlN high quality.

Then, an AlN layer 102 with a film thickness of 12 nm is formed at the temperature held at 1175 degrees Celsius by using an ammonia gas and a trimethyl aluminum (TMA) as raw materials.

Then, a $H_2/NH_3$ gas mixture is fed into the reactor of the MOVPE apparatus such that the $H_2/NH_3$ ratio is 3, to cool the SiC substrate 101 in the $H_2/NH_3$ gas mixture atmosphere to a set temperature of 1000 degrees Celsius (SiC substrate cooling step).

Then, a GaN layer 103 with a thickness of 480 nm is formed over the AlN layer 102a by using an ammonia gas and a trimethyl gallium (TMG) as raw materials at the temperature of 1000 degrees Celsius.

Subsequently, an AlGaN layer 104 having a film thickness of 30 nm is formed over the GaN layer 103 by using an ammonia gas, TMA, and TMG and at the temperature of 1000 degrees Celsius in the same MOVPE apparatus. The above steps result in the formation of the nitride semiconductor epitaxial wafer 200.

In order to determine the ratio c/a of the lattice constants for this nitride semiconductor epitaxial wafer 200, precision measurement of the lattice constants is performed by Fewster method using a multi-purpose X-ray diffraction apparatus ("X'Pert" of PANalytical) and a copper $K\alpha 1$ line having a wavelength of 1.540562 Angstroms as an X-ray source. As a result, the 2 sigma value for a (−1−14) plane of the GaN layer 103 was 99.973 degrees, and the 2 sigma value for a (006) plane of the same GaN layer 103 was 126.068 degrees. From this result, the (−1−14) plane spacing of the GaN layer 103 in the resulting nitride semiconductor epitaxial wafer 200 is 1.00573 Å, while also the (006) plane spacing thereof is 0.86424 Å, and from these values, it is determined that the lattice constant in the a-axis orientation of the GaN layer 103 is 3.1879 Å, and the lattice constant in the c-axis orientation of the GaN layer 103 is 5.1855 Å. From this result, it is confirmed that the ratio c/a of the lattice constants of the GaN layer 103 in the resulting nitride semiconductor epitaxial wafer 200 is 1.6266.

The source electrode 106, the drain electrode 107 and the gate electrode 108 are each formed on the AlGaN layer 104 using a photolithography technique. Finally, the field effect nitride transistor 100 is provided by the above process.

Method of Measuring the Current Collapse

Figure 2:
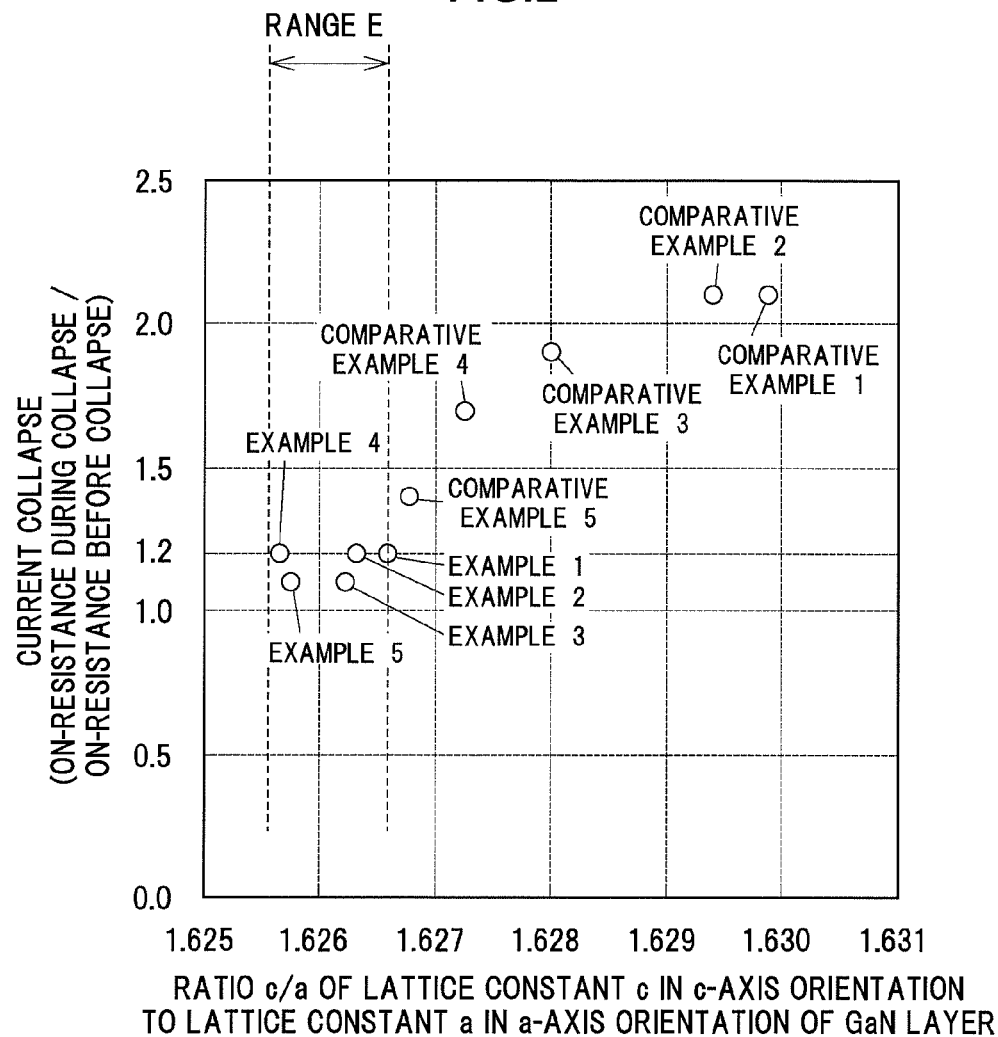
FIG. 2 shows a relationship between the c/a ratio of a lattice constant c in a c-axis orientation to a lattice constant a in an a-axis orientation of a GaN layer of a GaN layer and the current collapse, of field effect nitride transistors in Examples according to the invention.
Figure 3:
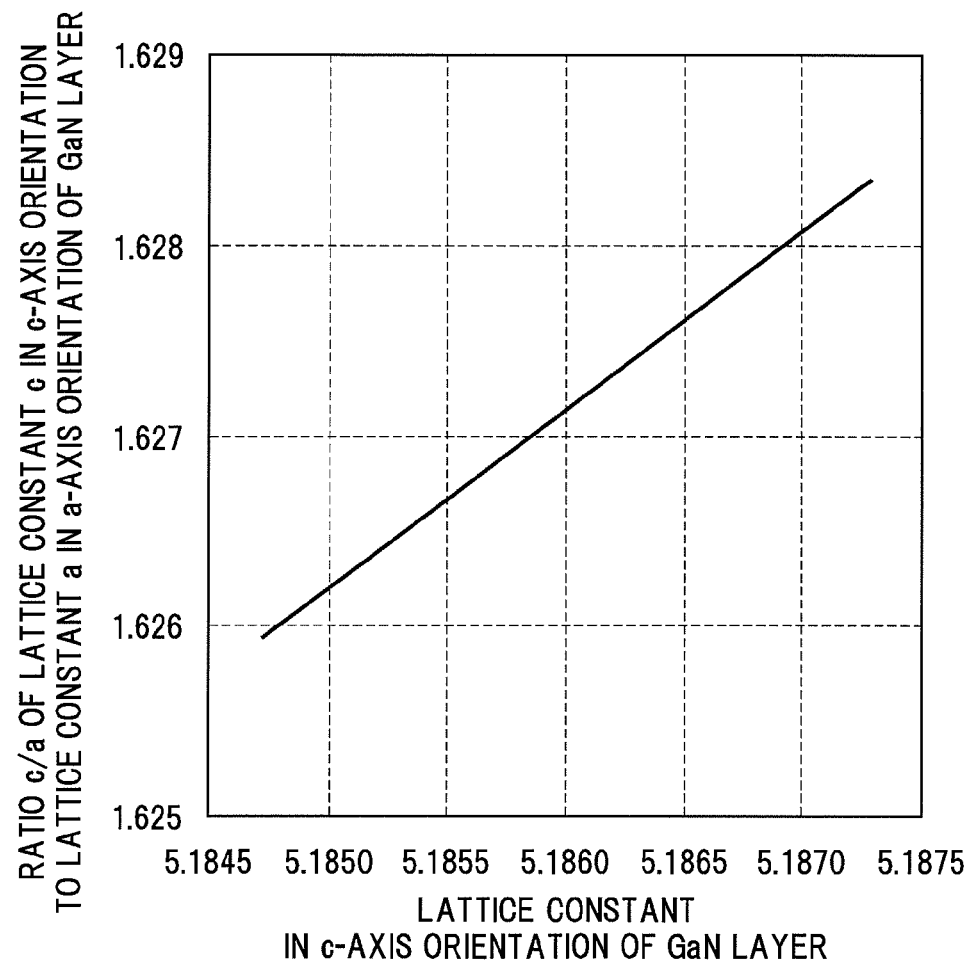
FIG. 3 is a graph showing a relationship between the lattice constant in a c-axis orientation of a GaN layer and the c/a ratio of a lattice constant c in a c-axis orientation to a lattice constant a in an a-axis orientation of the GaN layer.

In Example 1, the current collapse was measured by pulse I-V as an example. The same applied to other Examples and Comparative examples. FIG. 2 shows a measured result of the current collapse of Example 1.

Examples 2 to 5

In Examples 2 to 5, a field effect nitride transistor was produced in the same manner as in Example 1, except that the $H_2/NH_3$ ratio in the $H_2/NH_3$ gas mixture during the SiC substrate cooling step after the formation of the AlN layer was altered within a range not greater than 4 (i.e. ≤4). The $H_2/NH_3$ gas mixture during the SiC substrate cooling step after the formation of the AlN layer was fed by adjusting the $H_2/NH_3$ ratio to 4 in Example 2, to 2.5 in Example 3, to 1 in Example 4, and to 2 in Example 5. The ratios c/a of the lattice constants of the GaN layers formed in Examples 2 to 5 were each 1.6256 to 1.6263. FIG. 2 shows measured results of the current collapse.

Comparative Examples 1 to 5

In Comparative examples 1 to 5, a field effect nitride transistor was produced in the same manner as in Example 1, except that the $H_2/NH_3$ ratio in the $H_2/NH_3$ gas mixture during the SiC substrate cooling step after the formation of the AlN layer was set to be greater than 4 (i.e. >4). The $H_2/NH_3$ gas mixture during the SiC substrate cooling step after the formation of the AlN layer was fed by adjusting the $H_2/NH_3$ ratio to 8 in Comparative example 1, to 9 in Comparative example 2, to 7 in Comparative example 3, to 6 in Comparative example 4, and to 5 in Comparative example 5. The ratios c/a of the lattice constants of the GaN layers formed in Comparative examples 1 to 5 were each 1.6268 to 1.6299. FIG. 2 shows measured results of the current collapse.

As clearly understood from FIG. 2, the GaN layers formed in Examples 1 to 5 presented the values of the ratio c/a of the lattice constants within the range E of not less than 1.6256 and not more than 1.6266, and all presented the values of the current collapse of not more than 1.2. On the other hand, the GaN layers formed in Comparative examples 1 to 5 presented the values of the ratio c/a of the lattice constants of greater than 1.6266, and the great values of the current collapse of not less than 1.4. From the above, it can be seen that the occurrence of the current collapse is suppressed by setting the ratio c/a of the lattice constants of the GaN layer at not more than 1.6266. Further, in the present Examples, the GaN layers were formed such that the ratio c/a of the lattice constants thereof was in the range of not less than 1.6256 and not more than 1.6266, to reduce the occurrence of the current collapse to not more than 1.2, by optimizing the introduced gas mixture ratio $H_2/NH_3$ during the SiC substrate cooling after the formation of the AlN layer. It is also possible to lower the ratio c/a of the lattice constants of the GaN layer by appropriately adjusting other producing conditions also allows. It can easily be assumed from the results of the Examples above that the smaller the ratio c/a of the lattice constants of GaN layer, the more reduced the occurrence of the current collapse.

The present invention is not limited to the above embodiment and the above Examples, but modifications may be made without altering the spirit and scope of the invention. For example, the nitride semiconductor epitaxial wafer and the field effect nitride transistor may be produced by step deletions, step additions, or step alterations in the producing method described above, without altering the spirit and scope of the invention.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. A field effect nitride transistor, comprising:
a substrate;
a GaN layer configured to be an electron transit layer provided over the substrate;
an AlGaN layer configured to be an electron feed layer provided over the GaN layer;
a source electrode and a drain electrode provided directly on the AlGaN layer, and
a gate electrode provided directly on the AlGaN layer between the source electrode and the drain electrode,
wherein the GaN layer comprises a wurtzite crystal structure, and a measured ratio c/a of the lattice constant c in a c-axis orientation of the GaN layer to a lattice constant a in the a-axis orientation of the GaN layer is not more than 1.6266 despite the application of lattice mismatch stresses at interfaces between the GaN layer and the substrate and the AlGaN layer, and
wherein the measured ratio c/a allows the occurrence of only negative charges on the surface of the GaN layer on which a two-dimensional electron gas is induced spatially due to the lattice mismatch stresses to suppress current collapse.

2. The field effect nitride transistor according to claim 1, wherein the GaN layer directly contacts an AlN layer on one side and the AlGaN layer on the other side.

3. A field effect nitride transistor, comprising:
a substrate;
a single GaN layer configured to be an electron transit layer provided over the substrate;
an AlGaN layer configured to be an electron feed layer provided directly on the GaN layer;
a source electrode and a drain electrode provided directly on the AlGaN layer, and
a gate electrode provided directly on the AlGaN layer between the source electrode and the drain electrode,
wherein the GaN layer comprises a wurtzite crystal structure, and a measured ratio c/a of the lattice constant c in a c-axis orientation of the GaN layer to a lattice constant a in the a-axis orientation of the GaN layer is not more than 1.6266 despite the application of lattice mismatch stresses at interfaces between the GaN layer and the substrate and the AlGaN layer, and,
wherein the field effect nitride transistor includes only one GaN layer, and
wherein the measured ratio c/a of 1.6266 allows the occurrence of only negative charges on the surface of the GaN layer on which a two-dimensional electron gas is induced spatially to suppress current collapse.

4. The field effect nitride transistor according to claim 2, wherein the AlN layer has a surface shaped to have a positive skewness Rsk to prevent current collapse.

5. The field effect nitride transistor according to claim 2, wherein the positive skewness Rsk of the AlN layer is positive.

6. The field effect nitride transistor according to claim 2, wherein the positive skewness Rsk of the AlN layer is not less than 0.5.

* * * * *